US008021562B2

(12) United States Patent
Kato et al.

(10) Patent No.: US 8,021,562 B2

(45) Date of Patent: Sep. 20, 2011

(54) METHOD FOR MANUFACTURING A FILTER SUBSTRATE, INKJET RECORDING HEAD, AND METHOD FOR MANUFACTURING THE INKJET RECORDING HEAD

(75) Inventors: Masataka Kato, Naka-gun (JP); Makoto Terui, Yokohama (JP); Ryoji Kanri, Zushi (JP)

(73) Assignee: Canon Kabushiki Kaisha, Tokyo (JP)

( * ) Notice: Subject to any disclaimer, the term of this patent is extended or adjusted under 35 U.S.C. 154(b) by 487 days.

(21) Appl. No.: 12/174,559

(22) Filed: Jul. 16, 2008

(65) Prior Publication Data

US 2008/0277379 A1 Nov. 13, 2008

Related U.S. Application Data

(63) Continuation of application No. 11/263,425, filed on Oct. 31, 2005, now Pat. No. 7,416,285.

(30) Foreign Application Priority Data

Nov. 1, 2004 (JP) ................................ 2004-317801

(51) Int. Cl.

| | |
|---|---|
| *G01D 15/00* | (2006.01) |
| *G11B 5/127* | (2006.01) |
| *B44C 1/22* | (2006.01) |
| *C03C 15/00* | (2006.01) |
| *C03C 25/68* | (2006.01) |
| *H01L 21/302* | (2006.01) |
| *H01L 21/461* | (2006.01) |
| *C23F 1/00* | (2006.01) |

(52) U.S. Cl. ............................ 216/27; 216/58; 438/706

(58) Field of Classification Search ..................... 216/27
See application file for complete search history.

(56) References Cited

U.S. PATENT DOCUMENTS

| | | | | |
|---|---|---|---|---|
| 6,569,343 | B1 * | 5/2003 | Suzuki et al. | 216/27 |
| 6,783,689 | B2 * | 8/2004 | Kawamura et al. | 216/27 |
| 2004/0072107 | A1 * | 4/2004 | Kubota et al. | 430/320 |
| 2004/0141027 | A1 * | 7/2004 | Truninger et al. | 347/47 |

* cited by examiner

*Primary Examiner* — Nadine G Norton
*Assistant Examiner* — Stephanie Duclair
(74) *Attorney, Agent, or Firm* — Canon USA Inc IP Division

(57) ABSTRACT

A filter capable of separating or filtering micro foreign particles in a flow passage is provided. A first mask and a second mask are formed on a silicon substrate by dry etching. Before performing the dry etching, a resist of the first mask is subjected to a heat treatment performed at a temperature equal to or higher than a glass transition point. A resist of the second mask is not subjected to such a heat treatment. This processing simultaneously forms in the substrate a groove portion and a wall having a hole that is located in the groove portion. A silicon material located beneath a wide portion of the first mask remains as a wall portion separating the holes.

2 Claims, 8 Drawing Sheets

METHOD FOR MANUFACTURING A FILTER SUBSTRATE, INKJET RECORDING HEAD, AND METHOD FOR MANUFACTURING THE INKJET RECORDING HEAD

CROSS REFERENCE TO RELATED APPLICATIONS

This application is a continuation of U.S. patent application Ser. No. 11/263,425 filed Oct. 31, 2005, which claims priority from Japanese Patent Application No. 2004-317801 filed Nov. 1, 2004, all of which are hereby incorporated by reference herein in their entirety.

BACKGROUND OF THE INVENTION

1. Field of the Invention

The present invention relates to a manufacturing method for a filter substrate that is used in a micro analysis device, such as a microreactor, a chemical-chip, a bio-chip, or a nano-chip, which has a micro structure as part of its constituent members, such as a flow passage, a reaction tube, a reaction tank, an electrophoresis column, a chromatographic column, or a membrane separation mechanism.

More specifically, the present invention relates to a manufacturing method for a micro chemical device that includes two members bonded together in which a groove or comparable recessed portion is formed on a substrate surface of one member.

Furthermore, the present invention relates to devices that can be manufactured by using the above methods. For example, the present invention relates to an inkjet recording head used to perform recording with a droplet of ink or other liquid discharged onto a paper or other recording material, and also relates to a manufacturing method for the inkjet recording head.

2. Description of the Related Art

A micro analysis device, which uses a very small amount of solution to cause a reaction or to perform separation or analysis, is composed of a smooth substrate overlaid with a member having a micro flow passage formed therein. The smooth substrate has an inlet and an outlet for the solution. The micro flow passage is formed on the member by chemical processing or energy ray treatment. Then, the smooth substrate and the member are bonded together by using ultrasonic wave, heat, pressure, or chemical processing.

In general, the substrate is made of an inorganic material, such as silicon, silica glass, boron silicate glass or ceramic, or an organic material, such as plastic materials including polycarbonate and polyacrylamide, silicone rubber, or silicon resin. A typical chemical processing is a dry etching or a wet etching. An energy ray treatment can be realized by using a laser or ion beam. The flow passage width of a micro flow passage is generally in a range from 40 μm to 500 μm, although it is dependent on the usage of the device. The depth of the flow passage is in a range from 0.6 μm to 500 μm.

In a structural body having such a flow passage formed therein, it is necessary to provide a filter in the flow passage so as to remove or separate foreign particles contained in the solution flowing in the flow passage or so as to separate such substances by electrophoresis. As a method for forming a filter, it is possible to employ a method of filling a part of the flow passage with gel, polymer, or zeolite with reference to the size of substances to be separated, or a method of providing a plurality of columnar structural bodies in the flow passage that are formed by dry etching or wet etching so as to arrange a physical filter.

An inkjet recording head is a structural body that requires a filter formed in the liquid passage. In general, the inkjet recording head has a plurality of discharge pressure generating portions, each including a fine discharge port (i.e., an orifice), a liquid flow passage connected to the discharge port, and a discharge pressure generating element provided partly in the liquid flow passage. The discharge pressure generating element is constructed from, for example, an electrothermal transducer.

Japanese Patent No. 3143307 discloses a related manufacturing method for an inkjet recording head. According to this manufacturing method, a mold of a liquid flow passage is formed with a dissoluble resin on a substrate on which a discharge pressure generating element is formed. Subsequently, a coating resin containing an epoxy resin that is in a solid state at ordinary temperatures is dissolved in a solvent. This solution is coated on the dissoluble resin layer by solvent coating techniques. Thus, a coating resin layer that forms a flow passage wall separating liquid flow passages is molded. Subsequently, a discharge port is formed in the coating resin layer. Finally, the dissoluble resin layer is eluted and removed.

Furthermore, Japanese Patent Application Laid-open No. 10-95119 and Japanese Patent Application Laid-open No. 10-34928 disclose an inkjet recording head and its manufacturing method, according to which the height of a flow passage located close to a supply port is set to be greater than the height of a flow passage located close to a discharge pressure generating element. According to these conventional manufacturing methods, a portion of a substrate corresponding to an area extending from the vicinity of the supply port to the vicinity of the discharge pressure generating element is recessed to assure a sufficient height of the flow passage in the vicinity of the supply port. As a result, the liquid flow passage has a large cross-sectional area. Accordingly, even if the discharge frequency (i.e., driving frequency) is increased, ink can be surely refilled into the flow passage after a droplet is discharged.

It is a recent trend that a higher resolution image and a higher quality image are demanded. To this end, the density of arrangement of discharge ports on an inkjet recording head tends to increase. Accordingly, if the cross-sectional area of the liquid flow passage is increased, the height of the liquid flow passage becomes greater than the diameter of the discharge port. Therefore, very fine foreign particles may enter the liquid flow passage and may clog the discharge port. On the other hand, it is conventionally known that a columnar filter can be provided between an ink supply port and a liquid flow passage.

Japanese Patent No. 3143307 discloses a manufacturing method for easily manufacturing this kind of columnar filter. However, this columnar filter cannot bring about sufficient filtering effects regarding a direction perpendicular to the direction of the liquid flow passage.

On the other hand, according to a filter forming method that requires a step of filling a part of the flow passage with gel, polymer, or zeolite, some time is necessary for such a filling step in each operation of the device. In addition, such a filler has nonuniformity in the molecular structure of holes. This brings about differences in the separation function, and, accordingly, it is difficult to obtain a desired size for the filler. Such a problem is not limited to the above-described inkjet recording head, and a similar problem will arise even in a micro analysis device.

SUMMARY OF THE INVENTION

The present invention is directed to a manufacturing method for a filter substrate and to an inkjet recording head formed by using this manufacturing method.

In one aspect of the present invention, a method for manufacturing a filter substrate disposed in a flow passage includes the steps of: forming a groove on a surface of a substrate and forming in the groove a wall with a hole. This forming step includes a step of forming, as a first mask, a resist having a predetermined pattern on the surface of the substrate; a step of applying a heating treatment on the resist patterned as the first mask at a temperature equal to or higher than a glass transition point; a step of forming, as a second mask, a resist having a predetermined pattern on the surface of the substrate; a step of applying a heating treatment on the resist patterned as the second mask; and a step of dry etching on the substrate by using the first mask and the second mask. The step of forming in the groove the wall with the hole includes forming the resist patterned as the first mask with a difference in cross-sectional shape of the etched substrate between a portion of the substrate beneath the first mask and a portion of the substrate beneath the second mask due to a difference between the heat treatment applied to the first mask and the heat treatment applied to the second mask.

In another aspect of the present invention, an inkjet recording head is provided. The inkjet recording head includes a substrate including a discharge pressure generating element configured to generate a pressure for discharging liquid, and a supply port configured to externally supply the liquid to the discharge pressure generating element; a discharge port provided correspondingly with the discharge pressure generating element and configured to discharge the liquid; a liquid flow passage communicated with the discharge port and configured to lead the liquid supplied from the supply port to the discharge port; a recessed portion defined on a portion of the substrate adjacent to the discharge pressure generating element; and a wall with a hole provided in the recessed portion.

In a further aspect of the present invention, a manufacturing method for the above-described inkjet recording head is provided. The manufacturing method includes: forming, as a first mask, a resist having a predetermined pattern having a difference in cross-sectional shape on a surface of a substrate; applying a heating treatment on the resist patterned as the first mask at a temperature equal to or greater than a glass transition point; coating and forming, as a second mask, a resist having a predetermined pattern on the surface of the substrate; applying a heating treatment on the resist patterned as the second mask; performing dry etching on the substrate by using the first mask and the second mask; and forming the hole of the wall in the recessed portion by utilizing the difference in cross-sectional shape of the etched substrate between a portion of the substrate beneath the first mask and a portion of the substrate beneath the second mask due to a difference between the heat treatment applied to the first mask and the heat treatment applied to the second mask. Especially, when a positive resist is used as a mask material, two coated masks are subjected to heat treatment at respective different temperatures. Thus, portions of the etched substrate beneath the respective masks have different sectional shapes.

According to the method for manufacturing a filter substrate in an exemplary embodiment of the present invention, a wall with a hole formed by etching a substrate can be used as a filter. Thus, no damage or breakage occurs when the substrate is washed. Furthermore, compared with a filter having a columnar structural body in a flow passage, the filter performance can be improved in the horizontal direction relative to the flow passage direction. This increases the degree of freedom in the design and improves the capability of separating or filtering further micro foreign particles.

Moreover, according to the inkjet recording head and its manufacturing method in an exemplary embodiment of the present invention, even if the height of the ink flow passage is greater than the diameter of the discharge port, a filter capable of removing very fine foreign particles that may clog the discharge port can be provided.

Further features of the present invention will become more apparent from the following detailed description of exemplary embodiments with reference to the attached drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE EMBODIMENTS

Embodiments of the present invention will be described in detail with reference to the drawings.

First Embodiment

Figure 1A:
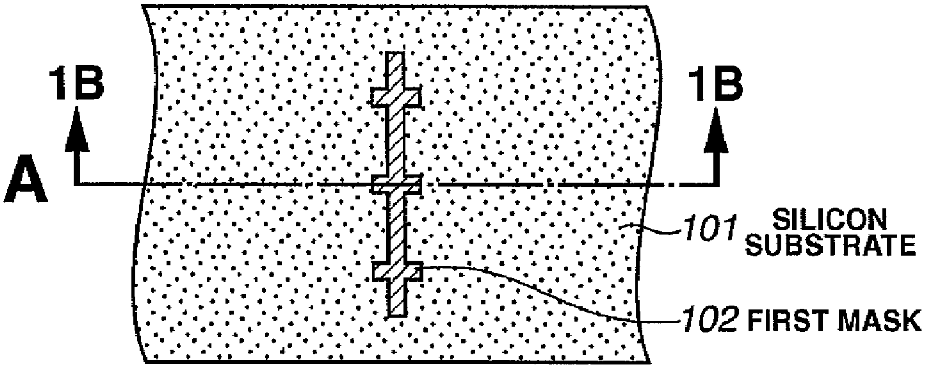
FIG. 1A is a plan view showing a first stage of a filter manufacturing method in accordance with a first embodiment of the present invention.
Figure 1B:
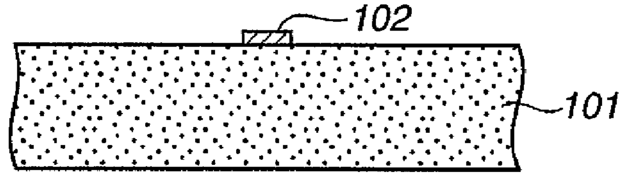
FIG. 1B is a cross-sectional view taken along line 1B-1B of FIG. 1A.
Figure 2A:
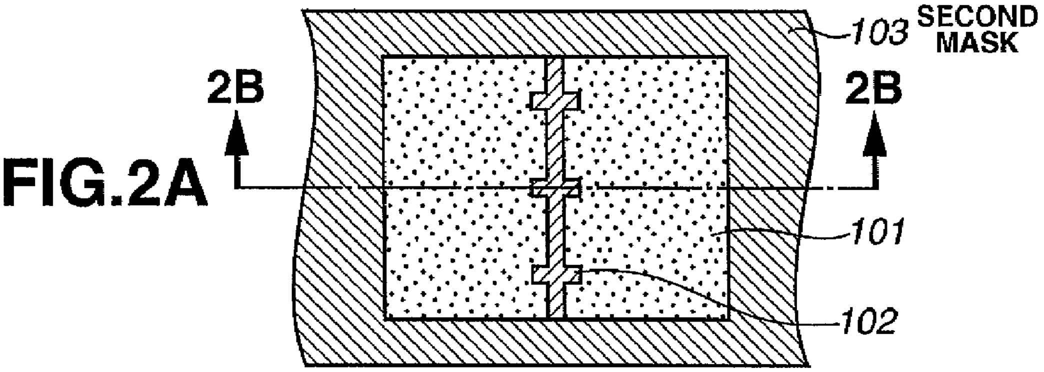
FIG. 2A is a plan view showing a second stage of the filter manufacturing method in accordance with the first embodiment of the present invention.
Figure 2B:
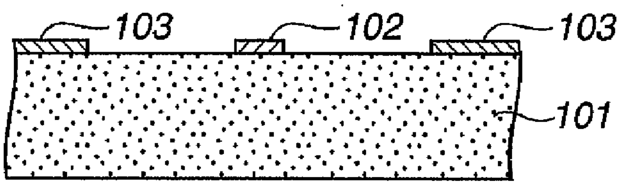
FIG. 2B is a cross-sectional view taken along line 2B-2B of FIG. 2A.
Figure 3A:
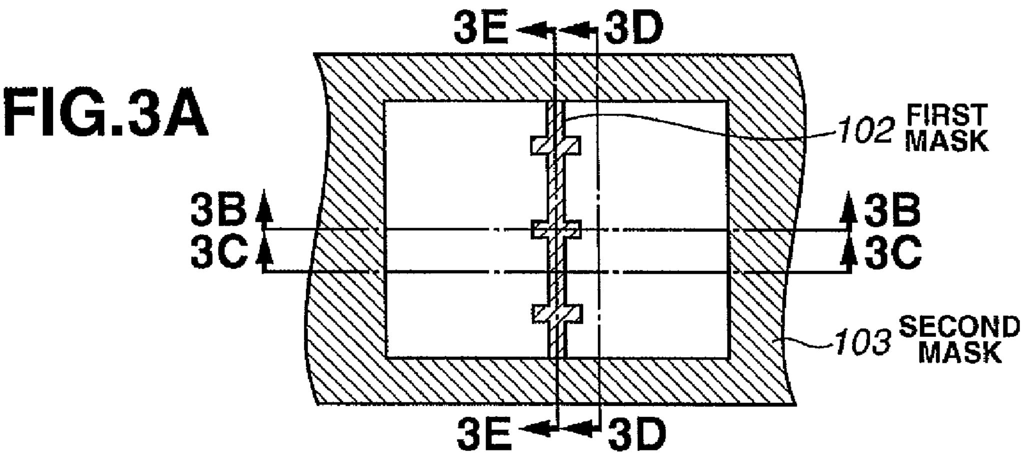
FIG. 3A is a plan view showing a third stage of the filter manufacturing method in accordance with the first embodiment of the present invention.
Figure 3B:
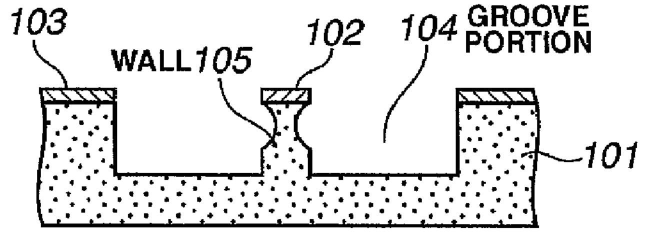
FIG. 3B is a cross-sectional view taken along line 3B-3B of FIG. 3A.
Figure 3C:
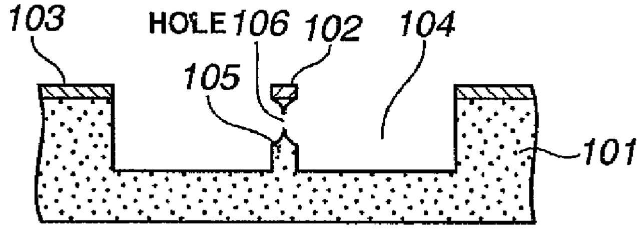
FIG. 3C is a cross-sectional view taken along line 3C-3C of FIG. 3A.
Figure 3D:
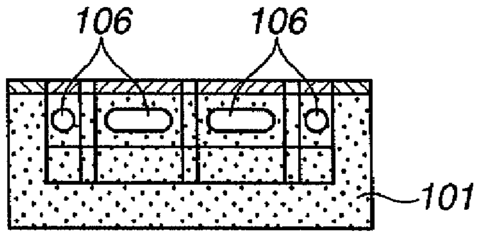
FIG. 3D is a cross-sectional view taken along line 3D-3D of FIG. 3A.
Figure 3E:
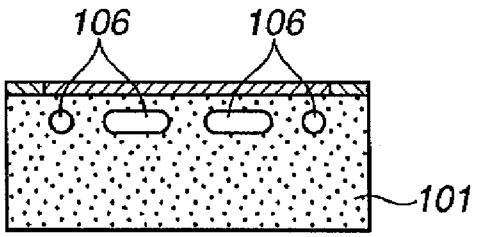
FIG. 3E is a cross-sectional view taken along line 3E-3E of FIG. 3A.
Figure 4:
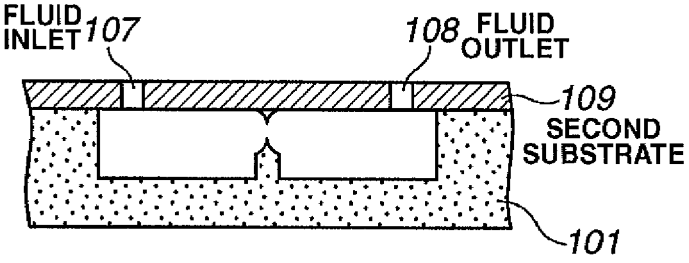
FIG. 4 is a cross-sectional view showing an embodiment of a micro flow passage filter formed in accordance with the present invention.

A method for manufacturing a filter disposed in a micro flow passage, as a first embodiment of the invention, will be described with reference to FIGS. 1A to FIG. 4. FIG. 1A is a plan view showing a first stage of the filter manufacturing method in accordance with the first embodiment. FIG. 1B is a cross-sectional view taken along line 1B-1B of FIG. 1A. FIG. 2A is a plan view showing a second stage of the filter manufacturing method in accordance with the first embodiment. FIG. 2B is a cross-sectional view taken along line 2B-2B of FIG. 2A. FIG. 3A is a plan view showing a third stage of the filter manufacturing method in accordance with the first embodiment. FIG. 3B is a cross-sectional view taken along line 3B-3B of FIG. 3A. FIG. 3C is a cross-sectional view taken along line 3C-3C of FIG. 3A. FIG. 3D is a cross-sectional view taken along line 3C-3D of FIG. 3A. FIG. 3E is a cross-sectional view taken along line 3E-3E of FIG. 3A. FIG. 4 is a cross-sectional view showing an embodiment of a micro flow passage filter formed in accordance with the present invention.

As shown in FIGS. 1A, 1B, 2A, and 2B, a first mask 102 and a second mask 103 are formed on a surface of a silicon substrate 101. The first mask 102 is formed by coating a predetermined pattern of a resist on the surface of the silicon substrate 101 and hard-baking the first mask 101 at a temperature equal to or higher than a glass transition point (Tg). Then, the second mask 103 is formed by subsequently coating a resist again in a predetermined pattern on the surface of the silicon substrate 101.

The first mask 102, as shown in FIG. 1A, is configured into a straight pattern with three portions thickened in width. Furthermore, as shown in FIG. 2A, the second mask 103 forms a frame-like pattern surrounding the first mask 102. Both ends of the first mask 102 are overlapped with the second mask 103.

According to the present embodiment, a novolac-based positive resist can be used to form the first mask 102 and the second mask 103. Then, according to a reactive ion etching method using this resist as a mask, the silicon substrate 101 is processed by dry etching. As a result, as shown in FIGS. 3B and 3E, a groove portion (i.e., a recessed portion) 104, a wall 105 formed in the groove portion 104, and a hole 106 formed in the wall 105 are simultaneously obtained.

According to a general dry etching, a substance emitted or released from a resist or a substrate causes a reaction to form a product deposited on a side wall of the pattern. This is a mechanism of an anisotropic etching utilizing a side wall protecting film. According to the present embodiment, after patterning of the first mask 102, a heat treatment is applied to the first mask 102 at a high temperature equal to or higher than the glass transition point Tg. This heat treatment brings about the effect of preventing the mask from being easily etched. Accordingly, as shown in FIGS. 3C and 3D, a wall 105 having a hole 106 therein can be formed. The hole 106 is formed at a portion corresponding to a narrow portion of the first mask 102 (refer to FIG. 3C). On the other hand, a silicon body located beneath a wide portion of the first mask 102 remains as the wall 105 separating the holes 106 (refer to FIG. 3B).

Furthermore, the etching for use in the present embodiment is a directional etching using an ion etching. A plasma source that produces ions is separated from a reaction chamber used for the etching, so that the etching can be performed by using accelerated ions. In general, using an ECR (electron cyclotron resonance) ion source that can emit high-density ions enables an anisotropic etching in a direction perpendicular to the surface. However, according to the present embodiment, active species contributing to the etching are excessively generated and scattered, so that the etching can advance to the side wall of the groove portion 104. Accordingly, the wall 105 having the hole 106 therein as shown in FIG. 3C can be formed.

Although the present embodiment shows formation of the groove portion 104 based on dry etching using the ECR ion source, the groove portion 104 can also be formed by using a dry etching apparatus having another type of plasma source. Furthermore, it is possible to use wet etching such as crystal anisotropic etching. For example, when an ICP (inductively coupled plasma) dry etching apparatus is employed, a groove portion can be formed on a substrate by alternately performing coating and etching (i.e., deposition/etching processes). In this case, $SF_6$ (Sulfur Hexafluoride) serving as an etchant is alternated with a gas that forms a coating on the surface of the groove portion. The etchant ions are directed toward the bottom of the groove portion and, along the bottom, physically and chemically remove a coating and a substrate material located beneath it.

Then, depending on a deposition amount of the coating, the ions can break through the coating on the bottom within several seconds. The coating time is set to be shorter than usual, so that substantially no coating is formed on the side wall. Thus, the etching can also advance to the sidewall during the etching step. Furthermore, as a method for actively reducing the coating amount on the side wall, it is possible to warm the substrate so that no deposition is formed on the side wall. Through the above-described processes, a filter substrate having the characteristic arrangement of the present embodiment is obtained.

Subsequently, as shown in FIG. 4, the silicon substrate 101 is bonded with a second substrate 109 to form a filter of a micro flow passage. In this case, the silicon substrate 101 is a first substrate in which the groove portion 104 is provided together with the wall 105 having the hole 106. The second substrate 109 has a fluid inlet 107 and a fluid outlet 108. According to the present embodiment, the second substrate 109 is made of silica. The bonding of the first substrate and second substrate is carried out at 1000° C. by thermocompression bonding.

The wall 105 having the hole 106, serving as a filter of the micro flow passage, extends in a direction perpendicular to the direction of the liquid flow passage. The hole 106 extends in a direction parallel to the bottom surface of the groove portion 104. Furthermore, the holes 106 of the wall 105 formed in the groove portion 104 are separated in a direction perpendicular to the bottom surface of the groove portion 104.

Second Embodiment

Next, with reference to FIGS. 5A to 13C, a manufacturing method for an inkjet recording head in accordance with a second embodiment of the present invention will be described.

Figure 5A:
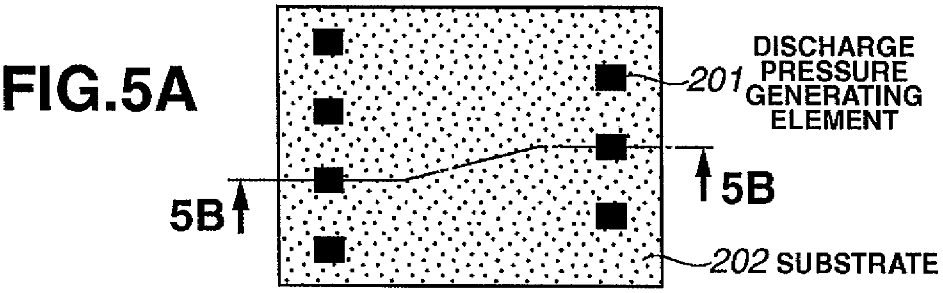
FIG. 5A is a plan view showing a first stage of an inkjet head manufacturing method in accordance with a second embodiment of the present invention.
Figure 5B:
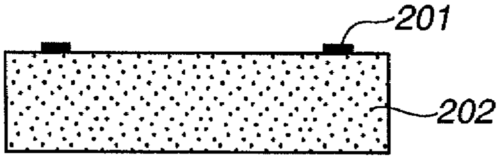
FIG. 5B is a cross-sectional view taken along line 5B-5B of FIG. 5A.
Figure 6A:
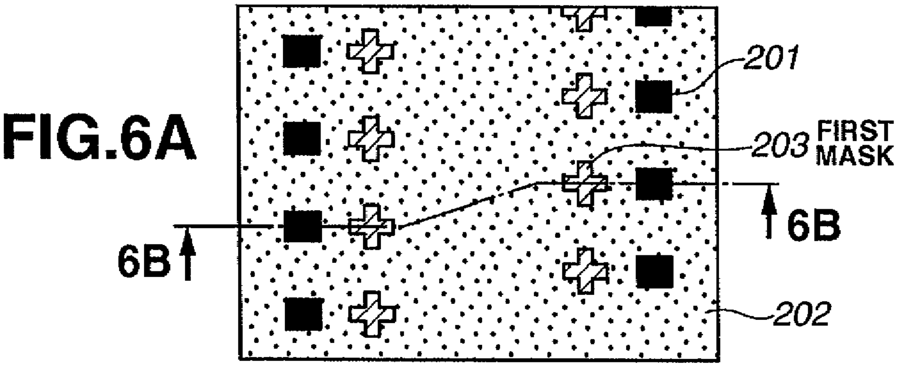
FIG. 6A is a plan view showing a second stage of the inkjet head manufacturing method in accordance with the second embodiment of the present invention.
Figure 6B:
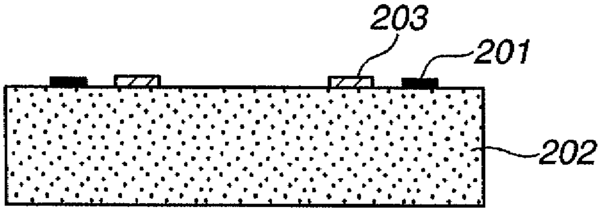
FIG. 6B is a cross-sectional view taken along line 6B-6B of FIG. 6A.
Figure 7A:
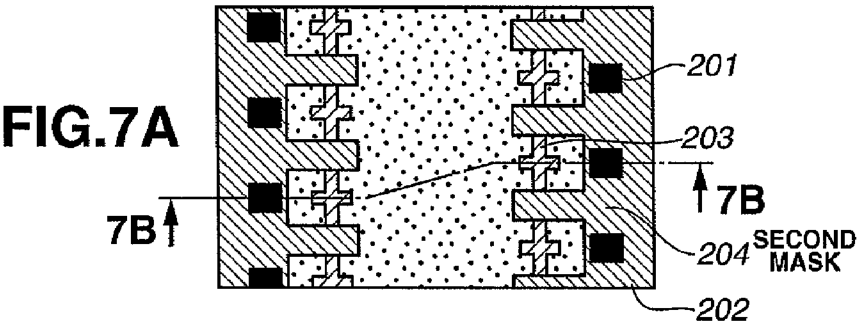
FIG. 7A is a plan view showing a third stage of the inkjet head manufacturing method in accordance with the second embodiment of the present invention.
Figure 7B:
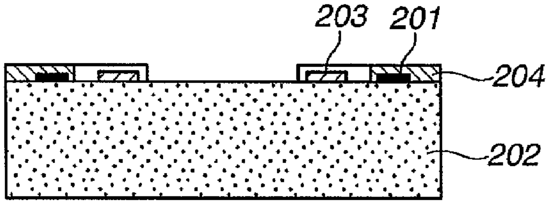
FIG. 7B is a cross-sectional view taken along line 7B-7B of FIG. 7A.
Figure 8A:
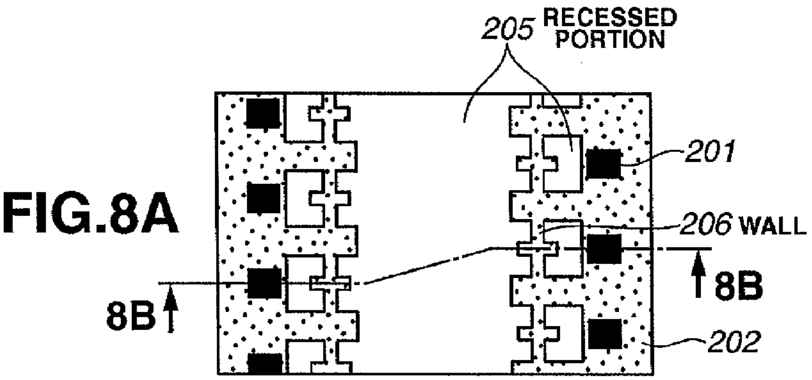
FIG. 8A is a plan view showing a fourth stage of the inkjet head manufacturing method in accordance with the second embodiment of the present invention.
Figure 8B:
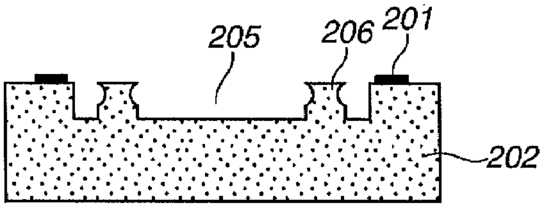
FIG. 8B is a cross-sectional view taken along line 8B-8B of FIG. 8A.

FIG. 5A is a plan view showing a first stage of the inkjet head manufacturing method in accordance with the second embodiment. FIG. 5B is a cross-sectional view taken along line 5B-5B of FIG. 5A. FIG. 6A is a plan view showing a second stage of the inkjet head manufacturing method in accordance with the second embodiment. FIG. 6B is a cross-sectional view taken along line 6B-6B of FIG. 6A. FIG. 7A is a plan view showing a third stage of the inkjet head manufacturing method in accordance with the second embodiment. FIG. 7B is a cross-sectional view taken along line 7B-7B of FIG. 7A. FIG. 8A is a plan view showing a fourth stage of the inkjet head manufacturing method in accordance with the second embodiment. FIG. 8B is a cross-sectional view taken along line 8B-8B of FIG. 8A.

Figure 9A:
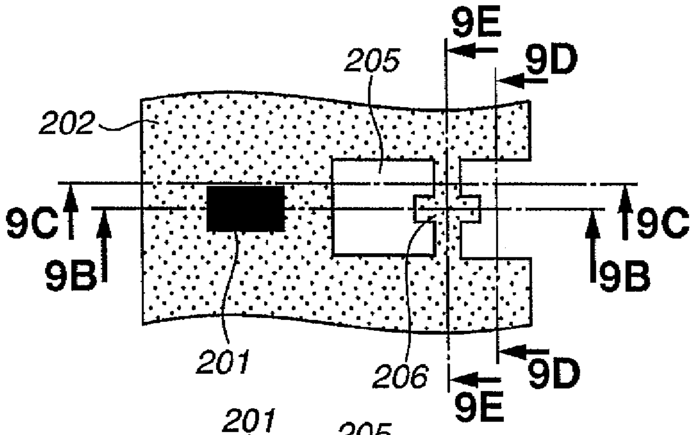
FIG. 9A is an enlarged plan view showing a part of the arrangement shown in FIG. 8A.
Figure 9B:
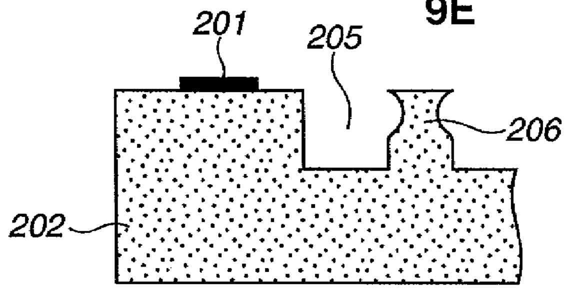
FIG. 9B is a cross-sectional view taken along line 9B-9B of FIG. 9A.
Figure 9C:
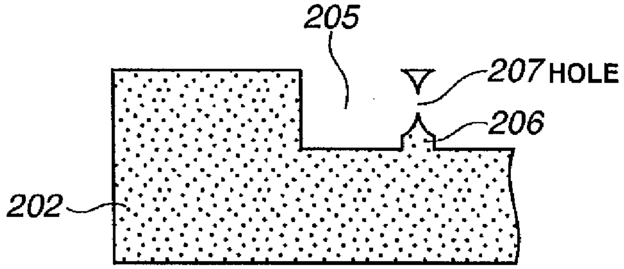
FIG. 9C is a cross-sectional view taken along line 9C-9C of FIG. 9A.
Figure 9D:
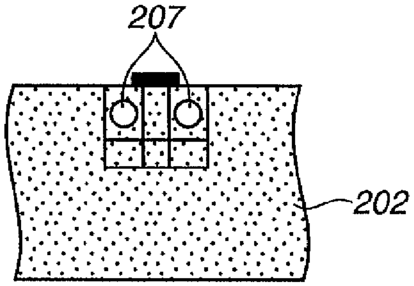
FIG. 9D is a cross-sectional view taken along line 9D-9D of FIG. 9A.
Figure 9E:
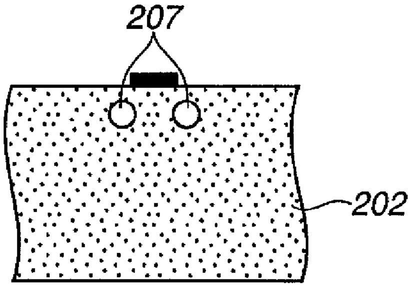
FIG. 9E is a cross-sectional view taken along line 9E-9E of FIG. 9A.
Figure 10:
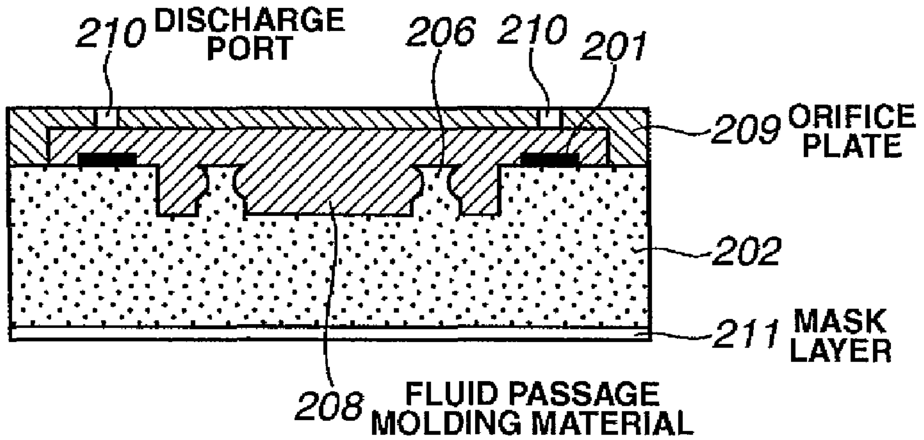
FIG. 10 is a cross-sectional view showing a fifth stage of the inkjet head manufacturing method in accordance with the second embodiment of the present invention.
Figure 11:
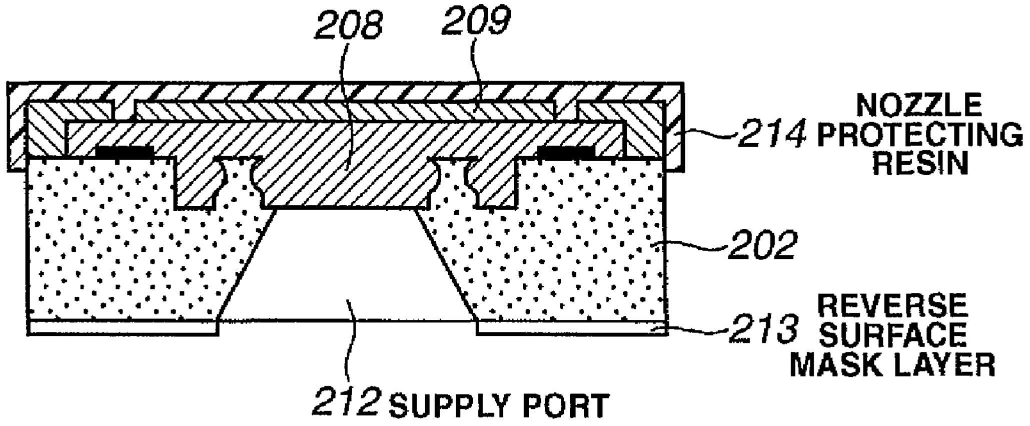
FIG. 11 is a cross-sectional view showing a sixth stage of the inkjet head manufacturing method in accordance with the second embodiment of the present invention.
Figure 12A:
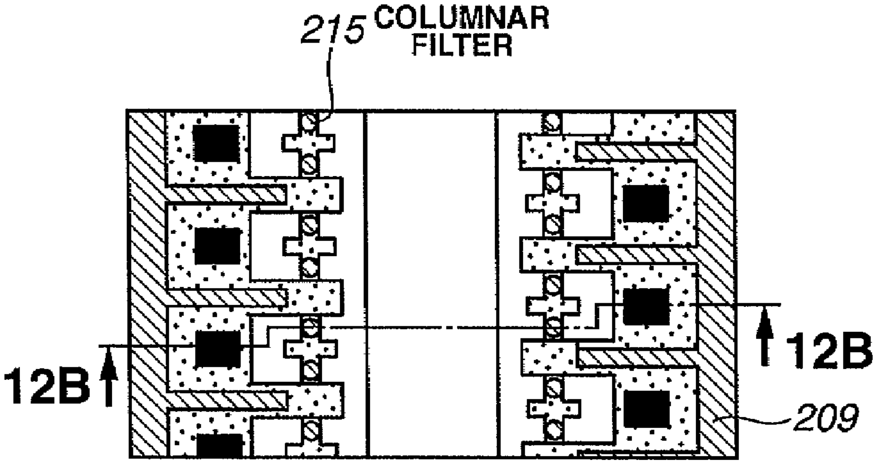
FIG. 12A is a plan view showing a seventh stage of the inkjet head manufacturing method in accordance with the second embodiment of the present invention.
Figure 12B:
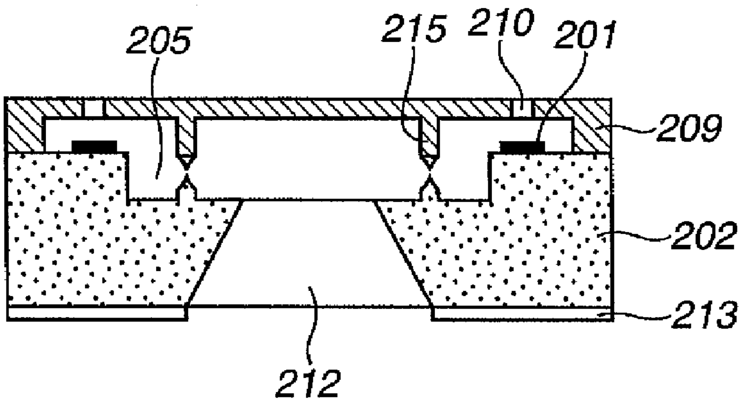
FIG. 12B is a cross-sectional view taken along line 12B-12B of FIG. 12A.
Figure 13A:
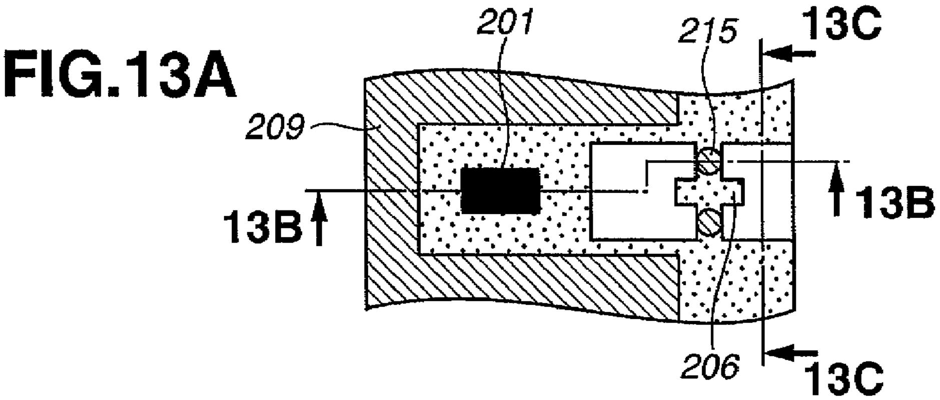
FIG. 13A is an enlarged plan view showing a part of the arrangement shown in FIG. 12A.
Figure 13B:
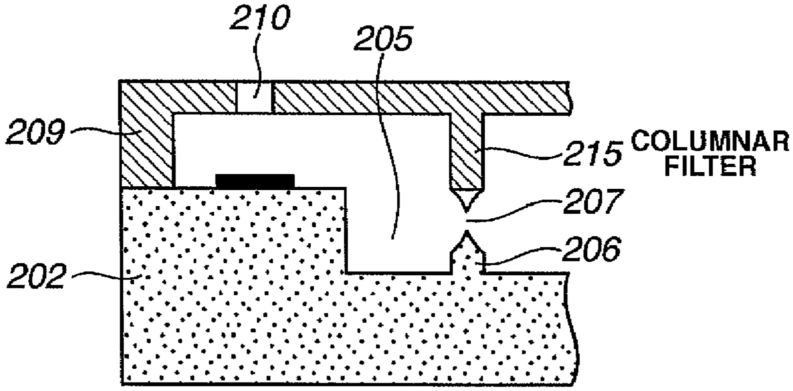
FIG. 13B is a cross-sectional view taken along line 13B-13B of FIG. 13A.
Figure 13C:
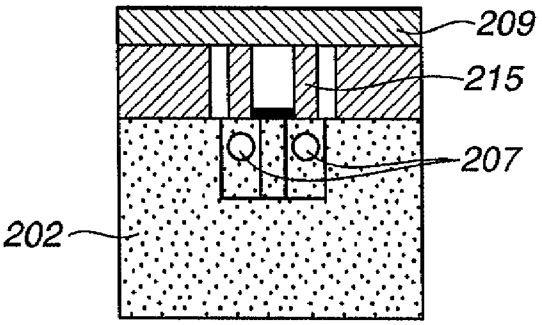
FIG. 13C is a cross-sectional view taken along line 13C-13C of FIG. 13A.

FIG. 9A is an enlarged plan view showing a part of the arrangement shown in FIG. 8A. FIG. 9B is a cross-sectional view taken along line 9B-9B of FIG. 9A. FIG. 9C is a cross-sectional view taken along line 9C-9C of FIG. 9A. FIG. 9D is a cross-sectional view taken along line 9D-9D of FIG. 9A. FIG. 9E is a cross-sectional view taken along line 9E-9E of FIG. 9A. FIG. 10 is a cross-sectional view showing a fifth stage of the inkjet head manufacturing method in accordance with the second embodiment. FIG. 11 is a cross-sectional view showing a sixth stage of the inkjet head manufacturing method in accordance with the second embodiment. FIG. 12A is a plan view showing a seventh stage of the inkjet head manufacturing method in accordance with the second embodiment. FIG. 12B is a cross-sectional view taken along line 12B-12B of FIG. 12A. FIG. 13A is an enlarged plan view showing a part of the arrangement shown in FIG. 12A. FIG. 13B is a cross-sectional view, taken along a line 13B-13B of FIG. 13A. FIG. 13C is across-sectional view taken along line 13C-13C of FIG. 13A.

The inkjet recording head manufactured in accordance with the second embodiment, as shown in FIG. 5A, includes a substrate 202 having a plurality of discharge pressure generating elements 201 formed therein each generating a pressure for discharging ink (i.e., a droplet). Although not shown in the drawings, the substrate 202 also has a semiconductor circuit and electrode pads formed thereon. The semiconductor circuit includes transistors for driving the discharge pressure generating elements 201. The electrode pads provide electrical connection between the recording head and a main body of the recording apparatus.

As shown in FIGS. 6A, 6B, 7A, and 7B, a first mask 203 is formed on a surface of the substrate 202, on which the discharge pressure generating elements 201 are formed, by coating a predetermined pattern of a resist and hard-baking the resist at a temperatures equal to or higher than a glass transition point (Tg). Subsequently, a second mask 204 is formed by coating a resist again in a predetermined pattern. The first mask 203 and the second mask 204 are configured, as shown in FIG. 7A, into shapes matched with an intended shape of a liquid flow passage having the discharge pressure generating element 201.

A novolac-based positive resist is usable to form the first mask 203 and the second mask 204 of the present embodiment. Then, according to a reactive ion etching method using this resist as a mask, the silicon substrate 202 is processed by dry etching. As a result, as shown in FIGS. 8A, 8B, and 9A to 9E, a recessed portion (i.e., a groove portion) 205, a wall 206 formed in the recessed portion 205, and a hole 207 formed in the wall 206 are simultaneously obtained. As apparent from the drawings, the hole 206 is formed at a portion corresponding to a narrow portion of the first mask 203 (refer to FIG. 9C).

On the other hand, a silicon body located beneath a wide portion of the first mask 203 remains as the wall 206 separating the holes 207 (refer to FIG. 9B). Through the above processes, a base body for an inkjet recording head having the characteristic arrangement of the present embodiment is obtained.

Next, polymethylisopropenylketone, as a UV resist that is dissoluble in a succeeding process, is solvent-coated on the front surface of the substrate 202 according to a spin coating method. This resist is then subjected to UV light for exposure and developing, thereby forming a fluid passage molding material 208 (refer to FIG. 10).

Next, a cationic polymerization epoxy resin is coated, as a negative resist, on the fluid passage molding material 208 to form an orifice plate 209. The orifice plate 209 forms a ceiling of an ink flow passage and a wall separating respective flow passages. Then, this negative resist is processed for exposure and developing with a predetermined pattern of photo mask, thereby removing the negative resist at the portions corresponding to the discharge ports 210 and the electrode pads (refer to FIG. 10).

Then, a mask layer 211 made of polyetheramide is provided on the reverse surface of the substrate 202 (refer to FIG. 10). A resist is formed on the mask layer 211 in a predetermined pattern having an opening in a predetermined region corresponding to an opposite side of a central region of the recessed portion 205 formed on the front surface of the substrate 202. Then, by using this resist as a mask, the dry etching is performed to remove the polyetheramide from the reverse surface of the substrate 202. Subsequently, the resist is removed. Through the above processes, a reverse surface mask layer 213 is formed in such a pattern that an opening is provided at a position where formation of a supply port 212 begins (refer to FIG. 11).

Next, the reverse surface of the substrate 202 is soaked into a mixed acid of nitric acid, hydrofluoric acid, and acetic acid, thereby starting a crystal anisotropic etching from the opening portion of the reverse surface mask layer 213. Then, by causing the crystal anisotropic etching to advance up to the recessed portion 205 formed on the front surface of the substrate 202, the supply port 212 is formed (refer to FIG. 11).

Next, a nozzle protecting resin 214, which is formed on the front surface of the orifice plate 209, is removed by using xylene. Subsequently, the base body is soaked into methyl lactate and is subjected to ultrasonic wave to elute and remove the UV resist that forms the fluid passage molding material 208 (refer to FIG. 12B).

Although not shown in the drawings, such base bodies can be formed simultaneously as a plurality of parts on a silicon wafer that forms the substrate 202. Then, individual parts are separated by dicing from the wafer, thus finally obtaining inkjet recording heads.

As described above, an inkjet recording head manufactured according to the processes shown in FIGS. 5A to 12B has a recessed portion provided at the bottom surface of an ink supply passage. Accordingly, even if the distance from the discharge port 210 to the discharge pressure generating element 201 is shortened, the flow resistance of the ink supply passage can be reduced, and prompt refilling of ink can be realized. Furthermore, the presence of the wall 206 having the hole 207 in the recessed portion 205 enables forming a filter capable of removing fine foreign particles without increasing the flow resistance.

In the present embodiment, in addition to the filter manufactured as described above, a columnar filter 215 is formed above the wall 206 having the hole 207 when the orifice plate shown in FIG. 10 is formed (refer to FIGS. 12A, 12B, and 13A to 13C).

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

What is claimed is:

1. A method for manufacturing a substrate for a liquid discharge head, comprising:

disposing a first etching mask formed of a resin, including two portions, one portion of which has a wider width than the other portion, the other portion of which has a narrower width than the one portion, on the substrate;

heating the first etching mask at a temperature equal to or higher than a glass transition point of the resin;

disposing a second mask having an opening on the substrate and surrounding the first mask; and forming a hole at a part of the substrate corresponding to the other portion having a narrower width than the one portion of the first etching mask by performing etching on the substrate, having the first etching mask as a mask, and by having etching advance at the part of the substrate corresponding to the other portion having a narrower width than the one portion of the first etching mask.

2. The method for manufacturing a substrate for a liquid discharge head according to claim 1, wherein the etching is ICP dry etching.

* * * * *